United States Patent [19]
Parkin

[11] Patent Number: 5,966,012
[45] Date of Patent: Oct. 12, 1999

[54] MAGNETIC TUNNEL JUNCTION DEVICE WITH IMPROVED FIXED AND FREE FERROMAGNETIC LAYERS

[75] Inventor: Stuart Stephen Papworth Parkin, San Jose, Calif.

[73] Assignee: International Business Machines Corporation, Armonk, N.Y.

[21] Appl. No.: 08/947,282

[22] Filed: Oct. 7, 1997

[51] Int. Cl.[6] .............................. G01R 33/02; G11C 11/15
[52] U.S. Cl. ......................... 324/252; 360/113; 365/171; 365/173; 365/158
[58] Field of Search ............................ 324/252; 360/113; 338/32 R; 365/171, 173, 158

[56] References Cited

U.S. PATENT DOCUMENTS

| | | | |
|---|---|---|---|
| 5,341,118 | 8/1994 | Parkin et al. | 338/32 R |
| 5,390,061 | 2/1995 | Nakatani et al. | 360/113 |
| 5,408,377 | 4/1995 | Gurney et al. | 360/113 |
| 5,465,185 | 11/1995 | Heim et al. | 360/113 |
| 5,477,482 | 12/1995 | Prinz | 365/129 |
| 5,541,868 | 7/1996 | Prinz | 365/98 |
| 5,640,343 | 6/1997 | Gallagher et al. | 365/171 |
| 5,650,958 | 7/1997 | Gallagher et al. | 365/173 |

*Primary Examiner*—Jay Patidar
*Attorney, Agent, or Firm*—Thomas R. Berthold

[57] ABSTRACT

An improved magnetic tunnel junction (MTJ) device for use in a magnetic recording read head or in a magnetic memory storage cell is comprised of two ferromagnetic layers, a "hard" or "fixed" ferromagnetic layer and a sensing or "free" ferromagnetic layer, which are separated by a thin insulating tunneling layer. Each of the ferromagnetic layers is a multilayer formed from two thinner ferromagnetic films coupled antiferromagnetically to one another across a thin antiferromagnetically coupling film. The antiferromagnetically coupling film is chosen, with regard to material composition and thickness, so that it causes the two ferromagnetic films which sandwich it to have their magnetic moments arranged antiparallel to one other in the absence of external magnetic fields. The magnetic moments of the fixed ferromagnetic multilayer and free ferromagnetic layer can be chosen to be arbitrarily small by making the two ferromagnetic films comprising each of them to have substantially the same magnetic moment. Thus the dipole fields from each of the fixed and free ferromagnetic multilayers can be minimized, thereby reducing the magnetic interaction between the fixed ferromagnetic multilayer and the free ferromagnetic multilayer.

12 Claims, 7 Drawing Sheets

MAGNETIC TUNNEL JUNCTION DEVICE WITH IMPROVED FIXED AND FREE FERROMAGNETIC LAYERS

RELATED APPLICATION

This application is related to application Ser. No. 08/895,118 filed Jul. 16, 1997, which is a continuation of application Ser. No. 08/618,300 filed Mar. 18, 1996 (now U.S. Pat. No. 5,650,958).

TECHNICAL FIELD

This invention relates in general to a magnetic tunnel junction (MTJ) device and more particularly to a MTJ device for use as a magnetoresistive (MR) head for reading magnetically-recorded data or for use as a magnetic storage cell in a magnetic nonvolatile memory device. More particularly, this invention relates to a MTJ device with improved ferromagnetic layers.

BACKGROUND OF THE INVENTION

A magnetic tunnel junction (MTJ) device is comprised of two ferromagnetic layers separated by a thin insulating tunnel barrier layer and is based on the phenomenon of spin-polarized electron tunneling. One of the ferromagnetic layers has a higher saturation field in one direction of an applied magnetic field, typically due to its higher coercivity than the other ferromagnetic layer. The insulating tunnel barrier layer is thin enough that quantum mechanical tunneling occurs between the ferromagnetic layers. The tunneling phenomenon is electron-spin dependent, making the magnetic response of the MTJ a function of the relative orientations and spin polarizations of the two ferromagnetic layers.

MTJ devices have been proposed primarily as memory cells for solid state memory. The state of the MTJ memory cell is determined by measuring the resistance of the MTJ when a sense current is passed perpendicularly through the MTJ from one ferromagnetic layer to the other. The probability of tunneling of charge carriers across the insulating tunnel barrier layer depends on the relative alignment of the magnetic moments (magnetization directions) of the two ferromagnetic layers. The tunneling current is spin polarized, which means that the electrical current passing from one of the ferromagnetic layers, for example, a layer whose magnetic moment is fixed or prevented from rotation, is predominantly composed of electrons of one spin type (spin up or spin down, depending on the orientation of the magnetic moment of the ferromagnetic layer). The degree of spin polarization of the tunneling current is determined by the electronic band structure of the magnetic material comprising the ferromagnetic layer at the interface of the ferromagnetic layer with the tunnel barrier layer. The first ferromagnetic layer thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged neither parallel nor antiparallel, the tunneling probability takes an intermediate value. Thus, the electrical resistance of the MTJ memory cell depends on the spin polarization of the electrical current and the electronic states in both of the ferromagnetic layers. As a result, the two possible magnetization directions of the ferromagnetic layer whose magnetization direction is not fixed uniquely define two possible bit states (0 or 1) of the memory cell. Although the possibility of MTJ memory cells has been known for some time, serious interest has lagged because of difficulties in achieving responses of the magnitude predicted in practical structures and at noncryogenic temperatures.

A magnetoresistive (MR) sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy ($Ni_{81}Fe_{19}$). A component of the read element resistance varies as the square of the cosine of the angle between the magnetization direction in the read element and the direction of sense current through the read element. Recorded data can be read from a magnetic medium, such as the disk in a disk drive, because the external magnetic field from the recorded magnetic medium (the signal field) causes a change in the direction of magnetization in the read element, which in turn causes a change in resistance of the read element and a corresponding change in the sensed current or voltage.

The use of a MTJ device for a memory application has been proposed, as described in U.S. Pat. No. 5,640,343 and IBM's U.S. Pat. No. 5,650,958. The use of a MTJ device as a MR read head has also been proposed, as described in U.S. Pat. No. 5,390,061. One of the problems with such MTJ devices is that the magnetizations of the ferromagnetic layers generate magnetic dipolar fields. This leads to a magnetostatic interaction between the ferromagnetic layers within a particular device and to magnetostatic interactions between MTJ devices in an array of such MTJ devices, such as an array of MTJ memory cells proposed for a nonvolatile magnetic memory array. The magnetostatic interaction become increasingly important as the cross-sectional area of the MTJ device or devices is reduced. For memory applications the magnetostatic interactions between neighboring MTJ memory cells means that the properties of an individual MTJ memory element will be affected by the state of the neighboring MTJ memory elements. This will limit the packing density of the MTJ elements in an array since neighboring MTJ memory elements have to be spaced further apart than would otherwise be required. For MR read head applications the magnetostatic interaction between the ferromagnetic layers within the MTJ device limits the performance of the device. In addition, the magnetization of the flux sensing layer in the MR read head has to be progressively reduced as the data storage capacity of the magnetic recording system is increased to obtain the best performance.

In U.S. Pat. Nos. 5,477,482 and 5,541,868 it is proposed that giant magnetoresistance (GMR) elements in the shape of hollow cylinders or hollow washers be used to reduce magnetostatic interactions between elements in a magnetic memory array of GMR elements. This method is not useful for MR read head applications. Moreover this method introduces considerable complexity into the fabrication of the individual magnetic elements. Furthermore these elements are of necessity large since the elements will comprise several minimum-area lithography squares in order to create elements with hollow interiors. Thus these elements are not suitable for high density memory applications.

What is needed is a MTJ device in which the ferromagnetic layers have reduced net magnetic moments such that the magnetostatic interactions between these layers within a single device (for MR read head applications) or between MTJ devices (for memory applications) can be reduced in a controlled manner without significantly increasing the complexity of fabrication of the MTJ device.

SUMMARY OF THE INVENTION

The invention is an improved MTJ device for use especially in a magnetic recording read head in a magnetic recording system or in a magnetic memory storage cell in a magnetic nonvolatile memory. The MTJ device is essentially comprised of two ferromagnetic layers, a "hard" or "fixed" ferromagnetic layer and a sensing or "free" ferromagnetic layer, which are separated by a thin insulating tunneling layer. An improved MTJ device is obtained by using laminated ferromagnetic layers in which each of the fixed and free ferromagnetic layers is formed from at least two thinner ferromagnetic sublayers coupled antiferromagnetically to one another across a thin nonferromagnetic spacer layer. The spacer layer or antiferromagnetically coupling layer is chosen, with regard to material composition and thickness, so that it causes the two ferromagnetic sublayers which sandwich it to have their magnetic moments arranged antiparallel to one other in the absence of external magnetic fields. The magnetic moments of the fixed ferromagnetic layer and that of the free ferromagnetic layer can be chosen to be arbitrarily small by making the two ferromagnetic sublayers comprising each of them to have substantially the same magnetic moment. Thus the dipole fields from each of the fixed and free ferromagnetic layers in the MTJ device can be minimized, thereby reducing the magnetic interaction between the fixed ferromagnetic layer and the free ferromagnetic layer. For magnetic recording read head applications the improved MTJ device has improved sensitivity to magnetic fields. In addition, the fixed ferromagnetic layer is more stable against external perturbations including both magnetic field and temperature excursions. The improved MTJ device thereby allows for magnetic recording systems with higher areal densities of stored magnetic bits. For magnetic memory applications the improved MTJ memory element has reduced interactions with neighboring elements, thereby enabling greater packing densities of these elements and thus increased memory capacities.

For a fuller understanding of the nature and advantages of the present invention, reference should be made to the following detailed description taken together with the accompanying figures.

DETAILED DESCRIPTION OF THE INVENTION

Prior Art

Although the MTJ device of the present invention will be described below as embodied as a MR sensor in a magnetic recording disk drive, the invention is also applicable to other MTJ applications, such as memory cells, and other magnetic recording systems, such as magnetic tape recording systems.

Figure 1:
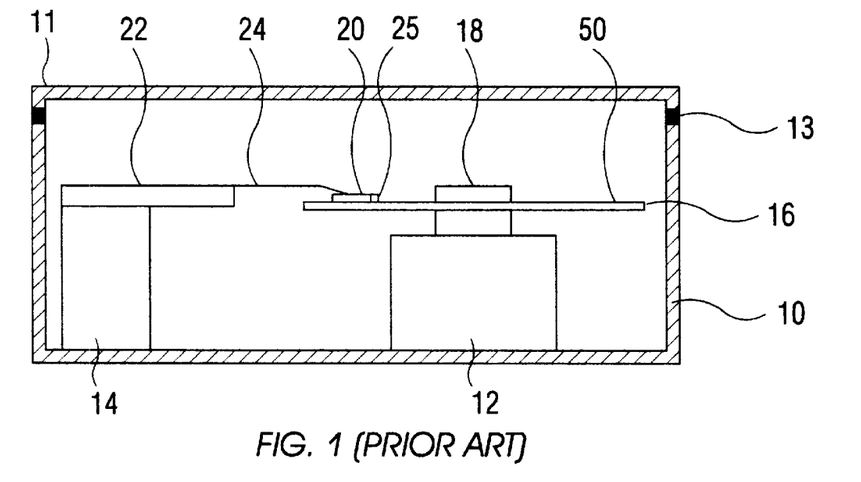
FIG. 1 is a simplified block diagram of a conventional magnetic recording disk drive for use with the MTJ MR read head according to the present invention.

Referring first to FIG. 1, there is illustrated in sectional view a schematic of a prior art disk drive of the type using a MR sensor. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16 is connected to drive motor 12 by means of hub 18 to which it is attached for rotation by the drive motor 12. A thin lubricant film 50 is maintained on the surface of disk 16. A read/write head or transducer 25 is formed on the trailing end of a carrier, such as an air-bearing slider 20. Transducer 25 is a read/write head comprising an inductive write head portion and a MR read head portion, as will be described with respect to FIG. 3. The slider 20 is connected to the actuator 14 by means of a rigid arm 22 and a suspension 24. The suspension 24 provides a biasing force which urges the slider 20 onto the surface of the recording disk 16. During operation of the disk drive, the drive motor 12 rotates the disk 16 at a constant speed, and the actuator 14, which is typically a linear or rotary voice coil motor (VCM), moves the slider 20 generally radially across the surface of the disk 16 so that the read/write head 25 may access different data tracks on disk 16.

Figure 2:
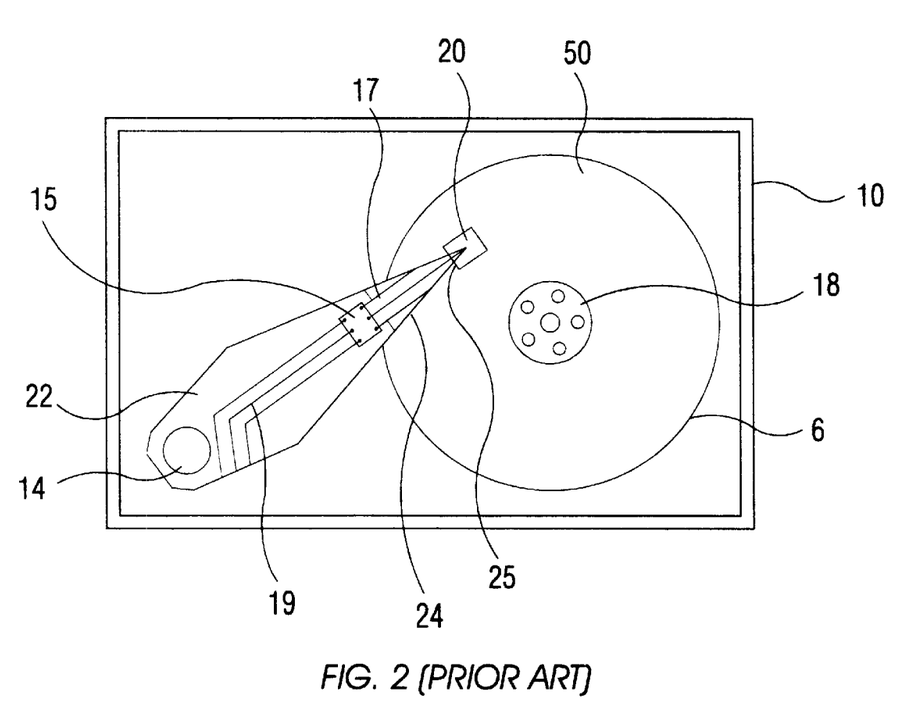
FIG. 2 is a top view of the disk drive of FIG. 1 with the cover removed.

FIG. 2 is a top view of the interior of the disk drive with the cover 11 removed, and illustrates in better detail the suspension 24 which provides a force to the slider 20 to urge it toward the disk 16. The suspension may be a conventional type of suspension, such as the well-known Watrous suspension, as described in IBM's U.S. Pat. No. 4,167,765. This type of suspension also provides a gimbaled attachment of the slider which allows the slider to pitch and roll as it rides on the air bearing. The data detected from disk 16 by the transducer 25 is processed into a data readback signal by signal amplification and processing circuitry in the integrated circuit chip 15 located on arm 22. The signals from transducer 25 travel via flex cable 17 to chip 15, which sends its output signals to the disk drive electronics (not shown) via cable 19.

Figure 3:
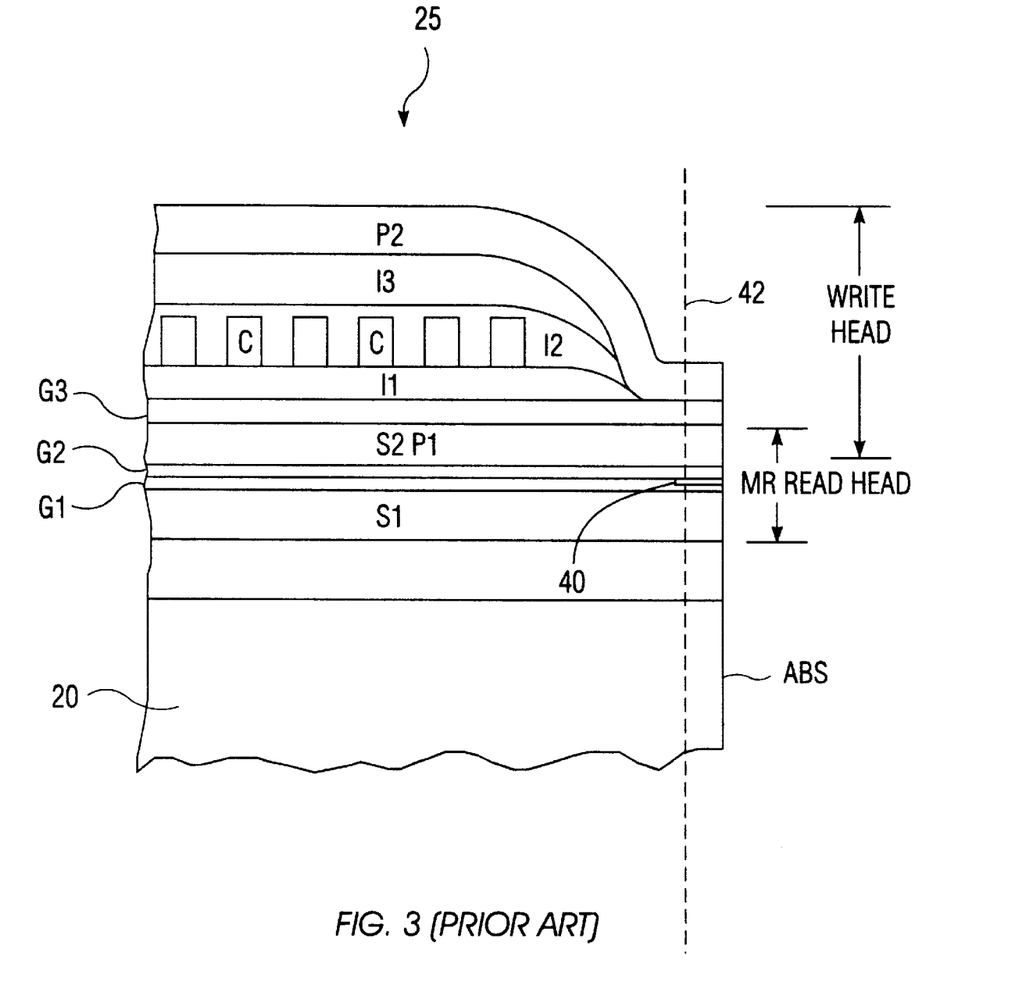
FIG. 3 is a vertical cross-section of a conventional inductive write head/MR read head with the MR read head located between shields and adjacent to the inductive write head.

FIG. 3 is a cross-sectional schematic view of the integrated read/write head 25 which includes a MR read head portion and an inductive write head portion. The head 25 is lapped to form an air-bearing surface (ABS), the ABS being spaced from the surface of the rotating disk 16 (FIG. 1) by the air bearing as discussed above. The read head includes a MR sensor 40 sandwiched between first and second gap layers G1 and G2 which are, in turn, sandwiched between first and second magnetic shield layers S1 and S2. In a conventional disk drive, the MR sensor 40 is an AMR sensor. The write head includes a coil layer C and insulation layer I2 which are sandwiched between insulation layers I1 and I3 which are, in turn, sandwiched between first and second pole pieces P1 and P2. A gap layer G3 is sandwiched between the first and second pole pieces P1, P2 at their pole tips adjacent to the ABS for providing a magnetic gap. During writing, signal current is conducted through the coil layer C and flux is induced into the first and second pole layers P1, P2 causing flux to fringe across the pole tips at the ABS. This flux magnetizes circular tracks on the rotating disk 16 during a write operation. During a read operation, magnetized regions on the rotating disk 16 inject flux into the MR sensor 40 of the read head, causing resistance changes in the MR sensor 40. These resistance changes are detected by detecting voltage changes across the MR sensor 40. The voltage changes are processed by the chip 15 (FIG. 2) and drive electronics and converted into user data. The combined head 25 shown in FIG. 3 is a "merged" head in which the second shield layer S2 of the read head is employed as a first pole piece P1 for the write head. In a piggyback head (not shown), the second shield layer S2 and the first pole piece P1 are separate layers.

The above description of a typical magnetic recording disk drive with an AMR read head, and the accompanying FIGS. 1–3, are for representation purposes only. Disk drives may contain a large number of disks and actuators, and each actuator may support a number of sliders. In addition, instead of an air-bearing slider, the head carrier may be one which maintains the head in contact or near contact with the disk, such as in liquid bearing and other contact and near-contact recording disk drives.

Preferred Embodiments

The present invention is a MTJ device with antiferromagnetically coupled multilayers functioning as the fixed and free ferromagnetic layers. In one embodiment the MTJ device is the sensor in an MR read head and is used in place of the MR sensor 40 in the read/write head 25 of FIG. 3.

Figure 4A:
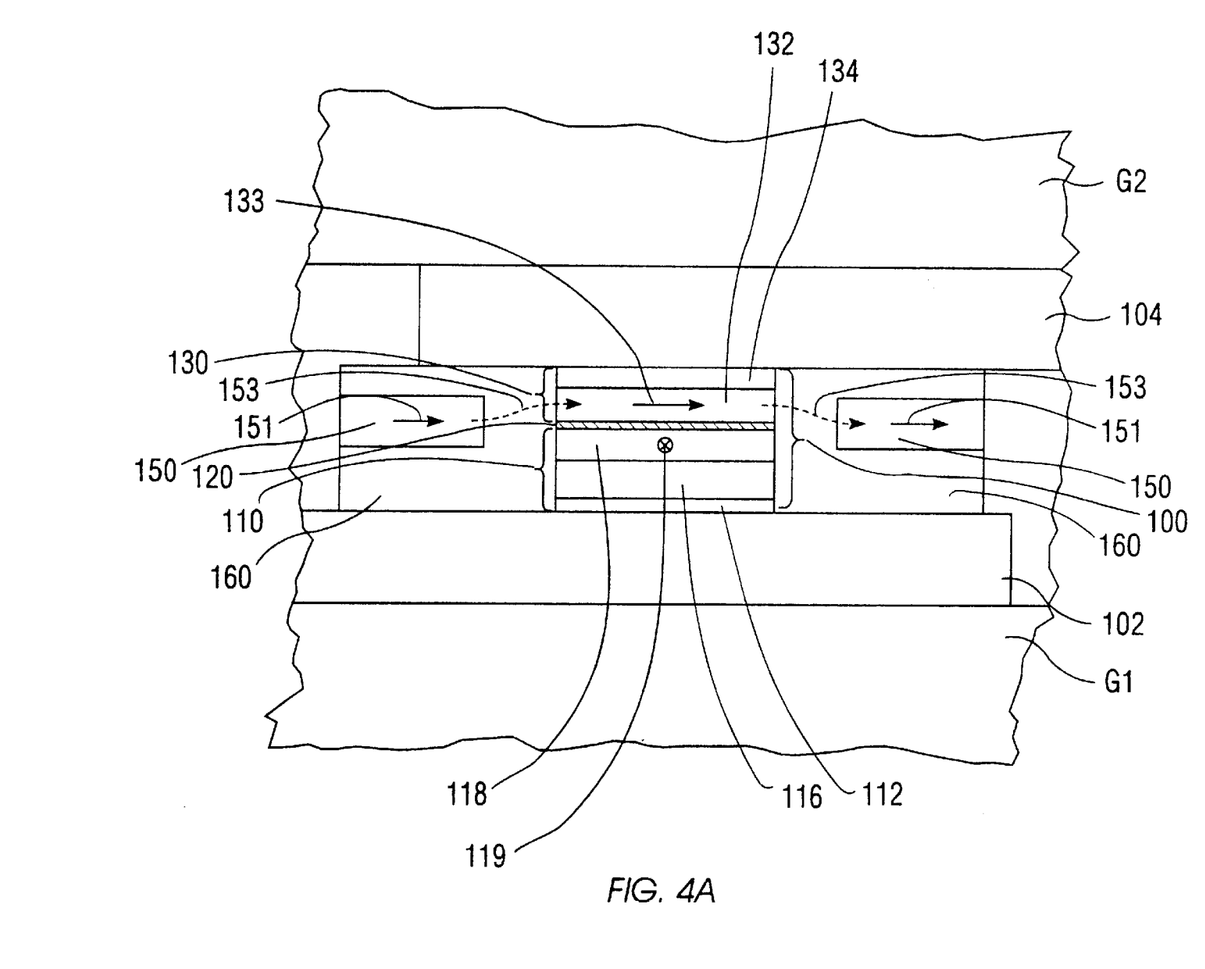
FIG. 4A shows a cross-section view of a MTJ MR read head of the present invention.

FIG. 4A is a section view of the MTJ MR read head of the present invention as it would appear if taken through a plane whose edge is shown as line 42 in FIG. 3 and viewed from the disk surface. Thus the paper of FIG. 4A is a plane parallel to the ABS and through substantially the active sensing region, i.e., the tunnel junction, of the MTJ MR read head to reveal the layers that make up the head. The MTJ MR read head includes a bottom electrical lead 102 formed on the gap layer G1 substrate, a top electrical lead 104 below gap layer G2, and the MTJ device 100 formed as a stack of layers between top and bottom electrical leads 102, 104.

The MTJ 100 includes a first electrode multilayer stack 110, an insulating tunnel barrier layer 120, and a top electrode stack 130. Each of the electrodes includes a ferromagnetic multilayer in direct contact with tunnel barrier layer 120, i.e., pinned or fixed ferromagnetic multilayer 118 and free or sensing ferromagnetic multilayer 132.

The base electrode layer stack 110 formed on electrical lead 102 includes a seed or "template" layer 112 on the lead 102, a layer of antiferromagnetic material 116 on the template layer 112, and a fixed ferromagnetic multilayer 118 formed on and exchange coupled with the underlying antiferromagnetic layer 116. The ferromagnetic multilayer 118 is called the fixed layer because its net magnetic moment or magnetization direction is prevented from rotation in the presence of applied magnetic fields in the desired range of interest. The top electrode stack 130 includes a sensing ferromagnetic multilayer 132 and a protective or capping layer 134 formed on the sensing multilayer 132. The sensing ferromagnetic multilayer 132 is not exchange coupled to an antiferromagnetic layer, and its net magnetic moment or magnetization direction is thus free to rotate in the presence of applied magnetic fields in the range of interest. The sensing ferromagnetic multilayer 132 is fabricated so as to have its net magnetic moment or magnetization direction (shown by arrow 133) oriented generally parallel to the ABS (FIG. 3) and generally perpendicular to the magnetization direction of the fixed ferromagnetic multilayer 118 in the absence of an applied magnetic field. The fixed ferromagnetic multilayer 118 in electrode stack 110 just beneath the tunnel barrier layer 120 has its magnetization direction fixed by interfacial exchange coupling of its lower ferromagnetic layer 200 with the immediately underlying antiferromagnetic layer 116, which also forms part of bottom electrode stack 110. The magnetization direction of the fixed ferromagnetic multilayer 118 is oriented generally perpendicular to the ABS, i.e., out of or into the paper in FIG. 4A (as shown by arrow tail 119). (In a magnetic memory application for the MTJ device, the magnetization directions of the fixed ferromagnetic layer 118 and sensing ferromagnetic layer 132 would be aligned either parallel or antiparallel to one another in the absence of an applied magnetic field, and the magnetization direction of the sensing ferromagnetic layer 132 would switch between parallel and antiparallel in the presence of an applied magnetic field caused by write current to the memory element).

Figure 4B:
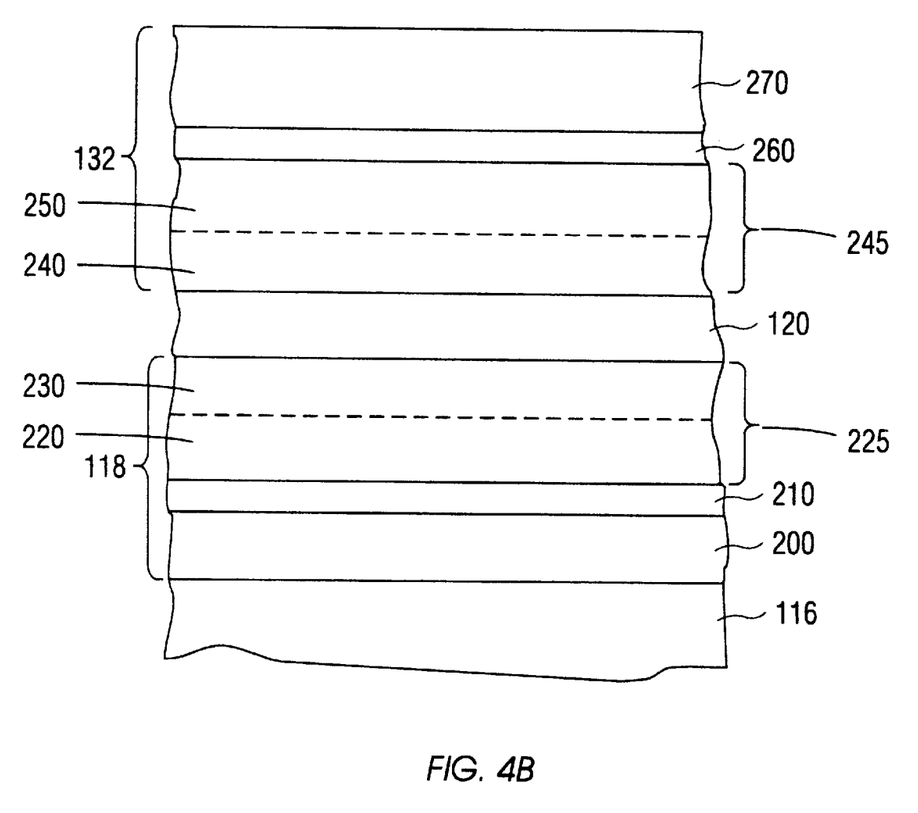
FIG. 4B is a cross-section of the MTJ element making up the MTJ MR read head shown in FIG. 4A.

As shown in FIG. 4B, the fixed ferromagnetic multilayer 118 is comprised of a sandwich of two ferromagnetic films 200 and 225 separated by a nonferromagnetic film 210 for the purpose of coupling the ferromagnetic films 200 and 225 antiferromagnetically such that the magnetic moments of films 200 and 225 are arranged antiparallel to one another. The two ferromagnetic films 200, 225 in the laminated fixed ferromagnetic multilayer 118 have magnetic moments that are antiparallel due to an antiferromagnetic exchange coupling through the antiferromagnetically coupling film 210. Because of this antiferromagnetic coupling, and because the two ferromagnetic films 200, 225 can be made to have substantially the same thickness, the magnetic moments of each of the films essentially cancel each other so that there is essentially no net magnetic moment in the fixed ferromagnetic multilayer 118. Thus, there is essentially no magnetic dipole field generated by the fixed ferromagnetic multilayer 118, and thus no magnetic field to affect the direction of magnetization of the sensing ferromagnetic layer 132. Because it is not possible to precisely form each of the films to the exact same thickness, the net moment of the fixed ferromagnetic multilayer 118 will likely be a small but nonzero value as a natural result of the normal deposition process. However, it may be desirable to deliberately deposit one of the fixed ferromagnetic films 200, 225 to a thickness slightly greater than that of the other film so that there would be a small nonzero net magnetic moment in the fixed ferromagnetic multilayer 118. This would assure that the magnetization of the fixed ferromagnetic multilayer 118 is stable in the presence of small magnetic fields so that the direction of its magnetization is predictable during the thermal setting of the antiferromagnetic exchange layer 116.

Similarly the ferromagnetic layer 132 is comprised of two ferromagnetic films 245 and 270 separated by a thin non-ferromagnetic film 260 which couples the moments of films 245 and 270 antiferromagnetically. The films 200 and 225 in fixed ferromagnetic layer 118 and films 245 and 270 in sensing ferromagnetic layer 132 may themselves be comprised of more than one ferromagnetic film but the magnetic moments of these subfilms will be aligned parallel to one another because adjacent ferromagnetic films will be coupled ferromagnetically to one another. For example, in FIG. 4B the ferromagnetic film 245 is depicted as being formed of two ferromagnetic subfilms 240 and 250. The net magnetic moment of film 245 is the sum of the magnetic moments of the subfilms 240 and 250. By contrast, the magnetic moment of the sensing ferromagnetic layer 132 will be the difference of the moments of the films 245 and 270 since the magnetic moments of these layers are aligned antiparallel to one another because of the presence of the antiparallel coupling layer 260. If each subfilm i has a thickness $t_i$ and defining these films to have unit thickness in the direction perpendicular to the plane of the paper in FIG. 4 then the magnetic moment of the subfilm i is $M_i*t_i$, where $M_i$ is the moment per unit area of this layer. $M_i$ will be positive or negative depending on the direction of the moment of the subfilm i along the direction parallel to the ABS (the direction of the arrow 133 in FIG. 4A). Thus the net moment of the sensing ferromagnetic layer 132 will the sum of the moments of each subfilm or film, taking into account the sign of $M_i$, i.e., the net moment of the sensing ferromagnetic layer is $\Sigma_i M_i*t_i$. The net moment of the sensing ferromagnetic layer 132 is less than the sum of the modulus of the moments of the individual films or subfilms (i.e. $\Sigma_i |M_i|*t_i$) because of the presence of the antiparallel coupling layer 260. An effective thickness of this layer may be defined as the equivalent thickness of a particular magnetic material which would have the same magnetic moment as that of the sensing ferromagnetic layer. For example an equivalent thickness of permalloy, $t^{Py}_{eff}$ is given by $t^{Py}_{eff} = (\Sigma_i M_i*t_i)/M_{Py}$. If the moments of the films 270 and 245 in ferromagnetic layer 132 are arranged to be very similar then $t^{Py}_{eff}$ can be made very small.

Also shown in FIG. 4A is a biasing ferromagnetic layer 150 for longitudinally biasing the magnetization of the sensing ferromagnetic multilayer 132, and an insulating layer 160 separating and isolating the biasing layer 150 from the sensing ferromagnetic multilayer 132 and the other layers of the MTJ device 100. The biasing ferromagnetic layer 150 is a hard magnetic material, such as a CoPtCr alloy, that has its magnetic moment (shown by arrow 151) aligned in the same direction as the magnetic moment 133 of the sensing ferromagnetic multilayer 132 in the absence of an applied magnetic field. The insulating layer 160, which is preferably alumina ($Al_2O_3$) or silica ($SiO_2$), has a thickness sufficient to electrically isolate the biasing ferromagnetic layer 150 from the MTJ 100 and the electrical leads 102, 104, but is still thin enough to permit magnetostatic coupling (shown by dashed arrow 153) with the sensing ferromagnetic multilayer 132. Each of the magnetic layers in the sensing ferromagnetic multilayer 132 has a thickness $t_i$ and a magnetic moment per unit area $M_i$ (where the area is in the plane normal to the plane of the paper in FIG. 4A and normal to the ABS i.e. such that the direction of the arrow 133 in FIG. 4A is normal to this plane). Then the net moment (taking account of the direction of $M_i$) of the sensing ferromagnetic multilayer per unit length (perpendicular to the plane of the paper in FIG. 4A) defined by the sum of the products $M_i*t_i$ (i.e. $\Sigma_i M_i*t_i$) must be less than or equal to the $M*t$ of the biasing ferromagnetic layer 150 to assure stable longitudinal biasing. For example, if the films within the sensing ferromagnetic multilayer 132 are comprised of permalloy $Ni_{(100-x)}$—$Fe_{(x)}$ (x being approximately 19) which is a typical ferromagnetic material used in the sensing ferromagnetic multilayer, and if the biasing ferromagnetic layer 150 is comprised of $Co_{75}Pt_{13}Cr_{12}$ which is a typical suitable hard magnetic material, then the moment per unit area of each permalloy film is about twice that of the biasing ferromagnetic layer. Thus the thickness of the biasing ferromagnetic layer 150 is at least approximately twice that of the effective thickness $t_{eff}$ of the sensing ferromagnetic multilayer 132 where $t_{eff}$ in this case is simply $|t_{245}-t_{270}|$.

A sense current I is directed from first electrical lead 102 perpendicularly through the antiferromagnetic layer 116, the fixed ferromagnetic multilayer 118, the tunnel barrier layer 120, and the sensing ferromagnetic multilayer 132 and then out through the second electrical lead 104. As described previously, the amount of tunneling current through the tunnel barrier layer 120 is a function of the relative orientations of the magnetizations of the fixed and sensing ferromagnetic multilayers 118, 132 that are adjacent to and in contact with the tunnel barrier layer 120. The magnetic field from the recorded data causes the magnetization direction of sensing ferromagnetic multilayer 132 to rotate away from the direction 133, i.e., either into or out of the paper of FIG. 4. This changes the relative orientation of the magnetic moments of the ferromagnetic multilayers 118, 132 and thus the amount of tunneling current, which is reflected as a change in electrical resistance of the MTJ 100. This change in resistance is detected by the disk drive electronics and processed into data read back from the disk. The sense current is prevented from reaching the biasing ferromagnetic layer 150 by the electrical insulating layer 160, which also insulates the biasing ferromagnetic layer 150 from the electrical leads 102, 104.

A representative set of materials for MTJ device 100 (FIGS. 4A–B) will now be described. All of the layers of the MTJ device 100 are grown in the presence of a magnetic field applied parallel to the surface of the substrate. The magnetic field serves to orient the easy axis of all of the ferromagnetic layers. A 5 nm Ta seed layer (not shown) is first formed on a 10–50 nm Au layer that serves as the bottom electrical lead 102. The seed layer is comprised of a material which encourages the (111) growth of the face-centered cubic (fcc) $Ni_{81}Fe_{19}$ template layer 112. The template ferromagnetic layer 112 encourages the growth of the antiferromagnetic layer 116. Suitable seed layer materials include fcc metals, such as Pt, Al, Cu, as well as Ta or a combination of layers, such as 3–5 nm Ta/3–5 nm Al. The MTJ base electrode stack 110 comprises a stack of 4 nm $Ni_{81}Fe_{19}$/10 nm $Mn_{50}Fe_{50}$/3 nm Co/0.5 nm Ru/2 nm Co (layers 112, 116, and multilayer 118, comprised of layers 200, 210 and 225, respectively) grown on the Ta seed layer on the 10–20 nm Au layer 102. The Au layer 102 is formed on the alumina gap material G1 that serves as the substrate. Next, the tunnel barrier layer 120 is formed by depositing and then plasma oxidizing a 0.5–2 nm Al layer. This creates the $Al_2O_3$ insulating tunnel barrier layer 120. The top electrode stack 130 is a 4 nm Ni—Fe/0.5 nm Ru/3 nm Ni—Fe/10 nm Ta stack (multilayer 132, comprised of layers 245, 260 and 270 and layer 134, respectively). The Ta layer 134 serves as a protective capping layer. The top electrode stack 130 is contacted by a 20 nm Au layer that serves as the top electrical lead 104.

Depending upon the materials selected for the ferromagnetic films 200, 225 and 245, 270 and their antiferromagnetically coupling film 210 and 260, respectively, there is a preferred antiferromagnetically coupling film thickness at which the ferromagnetic films become strongly antiferromagnetically coupled. For the case of the preferred Co/Ru/Co and Ni—Fe/Ru/Ni—Fe combinations, the thickness of the Ru antiferromagnetically coupling film can be selected from the well-known oscillatory coupling relationship described by Parkin et al. in *Phys Rev. Lett.*, Vol. 64, p. 2034 (1990). The peaks of this oscillatory relationship are those thicknesses at which antiferromagnetic coupling of the two Co or Ni—Fe films occurs, resulting in the desired antiparallel alignment of the magnetic moments in the two Ni—Fe films. For the Ni—Fe/Ru/Ni—Fe combination, the greatest antiferromagnetic exchange coupling strength occurs at less than approximately 10 Å. For the Co/Ru/Co combination, the greatest antiferromagnetic exchange coupling strength occurs at less than approximately 10 Å. The antiferromagnetically coupling film thickness must not be so thin, however, that a significant number of pin holes occur in the film, which would affect its antiferromagnetic coupling strength. Thus, in the case of Ru, the preferred thickness is in the range of approximately 4–8 Å.

Note that since the current passes perpendicular to the layers in MTJ device 100, the resistance of the MTJ device will be largely dominated by that of the tunnel barrier layer 120. Thus, the resistance per unit area of the conducting leads 102, 104 can be much higher than in conventional MR read heads in which the current flows parallel to the layers. Thus, the leads 102, 104 can be made thinner and/or narrower than in conventional MR head structures, and/or can be made from intrinsically more resistive materials, such as alloys or combinations of elements.

It is important that the layers in the bottom electrode stack 110 be smooth, and that the $Al_2O_3$ tunnel barrier layer 120 be free of pinholes which would electrically short the junction. For example, growth by sputtering techniques known to produce good giant magnetoresistance effects in metallic multilayer stacks is sufficient. In the MTJ device 100, the direction of the magnetic moments of the fixed and sensing ferromagnetic multilayers 118, 132, respectively, are approximately orthogonal to one another in zero applied magnetic field. The direction of the moment of the fixed multilayer 118 is largely determined by that of the exchange anisotropy field of the antiferromagnetic layer 116. The orientation of the moment of the sensing multilayer 132 is influenced by a number of factors, including the intrinsic anisotropy of the ferromagnetic multilayer layer itself and the shape of this layer. An intrinsic magnetic anisotropy can be induced in the sensing multilayer 132 by depositing it in a small magnetic field arranged to be perpendicular to that of the magnetization direction of the fixed layer 118. Proper orientation of the moment of sensing ferromagnetic multilayer 132 is accomplished by the presence of a longitudinal biasing ferromagnetic layer 150. The magnetostriction of the sensing ferromagnetic multilayer 132 is arranged to be close to zero (by choice of composition of the Ni—Fe alloy layers 245 and 270) so that any stresses in this layer induced by the fabrication process do not, of themselves, lead to any magnetic anisotropy.

In an alternative sensing ferromagnetic multilayer 132, ferromagnetic film 245 may include a thin subfilm 240 of Co or $Co_{(100-x)}Fe_{(x)}$ or $Ni_{(100-x)}Fe_x$ (x is approximately 60) at the interface between film 245 and the tunnel barrier layer 120, with the remainder (subfilm 250) of the ferromagnetic film 245 and film 270 being formed from a low magnetostriction material, such as $Ni_{(100-x)}Fe_x$ (x is approximately 19). The net magnetostriction of this type of sensing multilayer with a thin Co or $Co_{(100-x)}Fe_{(x)}$ (x is in the range of 20–70) or $Ni_{(100-x)}Fe_x$ (x is approximately 60) interface film is arranged to have a value close to zero by slight variations of the composition of the bulk of the ferromagnetic films which comprise the multilayer 132. In an alternative fixed ferromagnetic multilayer 118, ferromagnetic film 225 may be comprised largely of a bulk $Ni_{(100-x)}Fe_{(x)}$ subfilm 220 with a thin subfilm 230 of a Co or $Co_{(100-x)}Fe_{(x)}$ (x is in the range of 20–70) or $Ni_{(100-x)}Fe_x$ (x is approximately 60) layer at the interface with the tunnel barrier layer 120. The largest signal is obtained with Co or with the highest polarization $Ni_{(100-x)}Fe_x$ (x is approximately 60) or $Co_{(100-x)}Fe_{(x)}$ alloy (x is approximately 50). The interface layer is optimally about 1–2 nm thick. The net magnetostriction of the combined films is arranged to be close to zero by small variations of the composition. If the bulk of the films comprising the multilayer 118 is Ni—Fe, then the composition is $Ni_{81}Fe_{19}$, the composition for which bulk Ni—Fe has zero magnetostriction.

The Fe—Mn antiferromagnetic layer 116 may be replaced with a Ni—Mn layer or other suitable antiferromagnetic layer which exchange biases the ferromagnetic material in the fixed ferromagnetic layer 118 and which has a resistance which is substantially less than that of the $Al_2O_3$ barrier layer. For Ni—Mn suitable seed layers 112 include Ti, W or Ti—W.

Figure 5A:
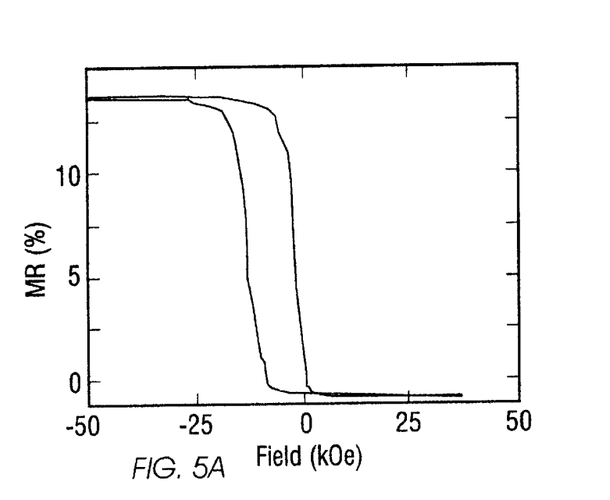
FIGS. 5A–C show magnetoresistance versus field curves for three MTJ devices with no antiparallel coupled fixed ferromagnetic and sensing ferromagnetic layers (5A), with an antiparallel coupled fixed ferromagnetic multilayer (5B) and with both antiparallel coupled fixed ferromagnetic and sensing ferromagnetic multilayers (5C) for a limited magnetic field range.
Figure 5B:
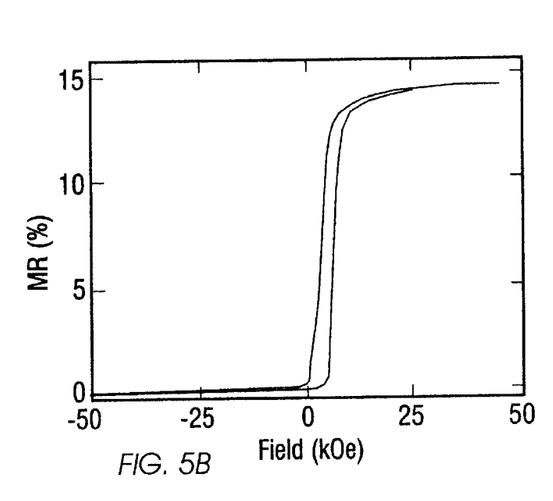
Figure 5C:
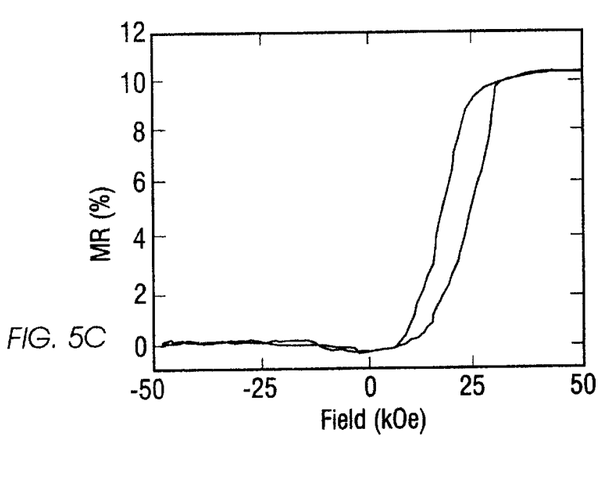

FIGS. 5A–5C compare the magnetoresistive response of a MTJ device without antiferromagnetically coupled fixed and free ferromagnetic layers to MTJ devices according to the present invention. Data are included only for a limited field range for which the ferromagnetic layer is fixed or pinned by its interaction with the exchange bias layer. FIG. 5A shows the resistance versus field curve of a structure of the form Si/50 ÅTa/150 ÅAl/40 Å$Ni_{81}Fe_{19}$/100 Å$Mn_{46}Fe_{54}$/36 Å$Ni_{81}Fe_{19}$/15 ÅCo/12 ÅAl oxidized 120 seconds/100 ÅAl/40 Å$Ni_{81}Fe_{19}$/200 ÅAl, where the fixed ferromagnetic layer is a single ferromagnetic layer (with a Co interface layer at the alumina tunnel barrier) and the free ferromagnetic layer is a single ferromagnetic layer.

FIG. 5B shows the magnetoresistive response of a similar MTJ device but wherein just the fixed ferromagnetic layer is an antiferromagnetically coupled multilayer of 30 ÅCo/7 ÅRu/25 ÅCo. The effective magnetic moment of the fixed ferromagnetic layer is only approximately 5 Å of cobalt which is approximately 7 times smaller than the moment of the fixed ferromagnetic layer of the structure in FIG. 5A. Whereas in FIG. 5A the resistance of the MTJ device is higher for small negative fields as compared to small positive fields, in FIG. 5B the magnetoresistive response is reversed and the resistance is higher in small positive fields. This result demonstrates that the fixed ferromagnetic layer is indeed formed of an antiferromagnetically coupled Co/Ru/Co sandwich. Since the lower Co film 200, by design, has a slightly larger magnetic moment than the upper Co film 225 because of its slightly greater thickness (30 Å compared to 25 Å) and because the lower Co film is in contact with the MnFe exchange bias layer 116, the moment of the lower Co film 200 is fixed in the direction of the exchange bias field of the MnFe layer 116 (which in FIG. 5A is in the positive field direction). Thus the moment of the upper Co film 225 is fixed in the negative field direction because the upper Co film 225 is coupled antiferromagnetically to the lower Co film 200 by exchange coupling via the Ru spacer layer 215. Thus in small positive fields the moment of the sensing ferromagnetic layer 132, which is free to rotate and follow the direction of the applied field, is oriented along the positive field direction and is thus opposite to the moment of the upper Co film 225 of the fixed ferromagnetic layer 118. Thus the resistance of the MTJ device is high. When the applied field direction is reversed and becomes slightly negative the moment of the sensing ferromagnetic layer 132 becomes oriented along the negative field direction and becomes parallel to that of the upper Co film 225. Thus the resistance of the MTJ device is reduced.

FIG. 5C shows the magnetoresistive response of a structure according to the present invention and similar to the structure whose responses in shown in FIG. 5B except that the sensing ferromagnetic layer is comprised of an antiferromagnetically coupled 40 Å $Ni_{81}Fe_{19}$/7 ÅRu/30 Å $Ni_{81}Fe_{19}$ sandwich. The magnetoresistive response curve is similar to that of FIG. 5B. In particular the resistance of the MTJ is high for small positive fields. However, the shape of the magnetoresistive response curve can clearly be distinguished from that of FIG. 5B. In particular the curve is no longer centered approximately about zero field but is shifted to small positive fields. Such a shift is consistent with a decreased anti-ferromagnetic coupling between the sensing ferromagnetic multilayer 132 and the fixed ferromagnetic multilayer 118 which is consistent with a reduced magnetostatic coupling between these layers resulting from the reduced magnetic moment of the sensing ferromagnetic layer. Note that in FIG. 5C the effective thickness of the sensing ferromagnetic layer is only approximately 10 Å of permalloy, which is ten times smaller than the thickness of the sensing ferromagnetic layer in FIGS. 5A and 5B without a substantial affect on the magnitude of the magnetoresistance of the MTJ device. Since the magnetostatic coupling between the fixed and sensing ferromagnetic layers is directly proportional to the magnetic moments of these layers the use of antiparallel coupling layers in the fixed and/or the sensing ferromagnetic layers leads to substantially reduced magnetostatic coupling between these layers.

Figure 6:
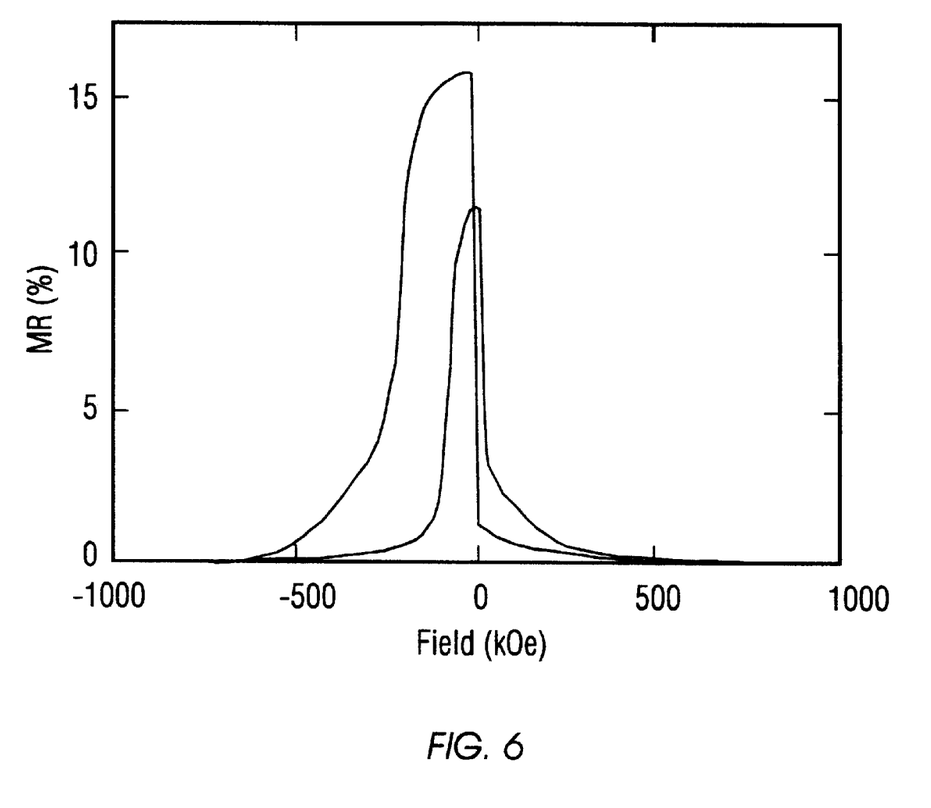
FIG. 6 shows the magnetoresistance versus field curve of the same structure whose response is shown in FIG. 5A, but over a magnetic field range sufficiently large to reorient completely the fixed ferromagnetic layer.
Figure 7A:
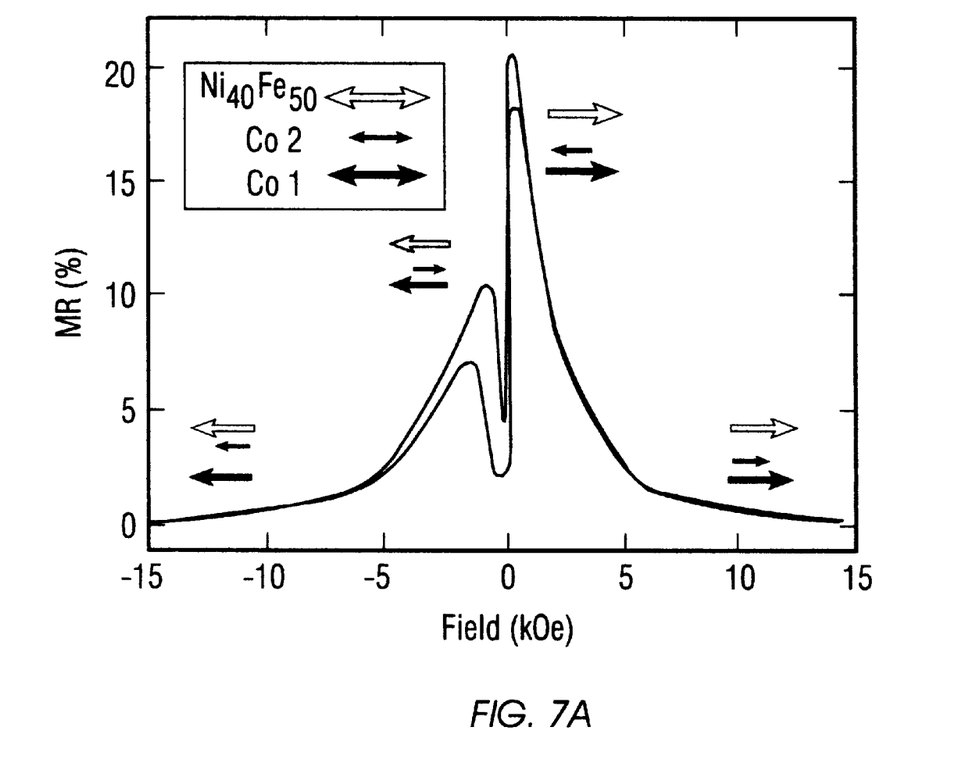
FIG. 7A shows the resistance versus field curve of a MTJ device with a antiparallel coupled fixed ferromagnetic layer over an extended magnetic field range.
Figure 7B:
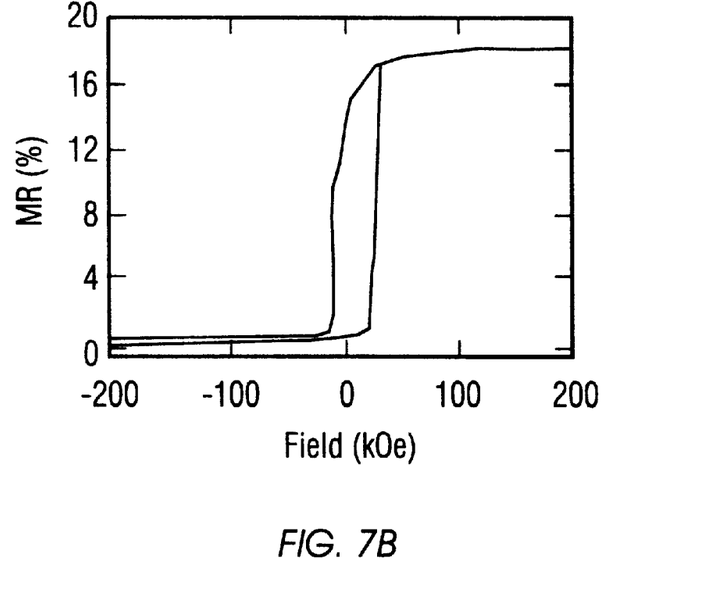
FIG. 7B shows the resistance versus field curve of a MTJ device with a antiparallel coupled fixed ferromagnetic layer over a limited field range.

Another advantage of an antiparallel coupled fixed ferromagnetic layer 118 is an effective increase in the magnitude of the exchange bias field provided by the antiferromagnetic layer 116. This is illustrated in FIG. 6 and FIGS. 7A–7B for the simpler case of a structure with only an antiparallel coupled fixed ferromagnetic layer. FIG. 6 shows the magnetoresistance versus field curve of the same sample as in FIG. 5A but over a magnetic field range sufficiently large to reorient completely the fixed ferromagnetic layer. These data correspond to the as-deposited structure without any subsequent annealing treatment. The exchange bias field of the fixed ferromagnetic layer is approximately 130 Oe with considerable coercivity (approximately 70 Oe). FIG. 7A shows the magnetoresistance versus field curve of a MTJ with an antiferromagnetically coupled fixed ferromagnetic multilayer 118 having a structure of the form Si/200 ÅAl/40 Å$Ni_{81}Fe_9$/100 Å$Mn_{46}Fe_{54}$/30 ÅCo/7 ÅRu/25 ÅCo/12 ÅAl oxidized 120 seconds/100 Å$Ni_{40}Fe_{60}$/200 ÅAl. A very large magnetic field of greater than approximately 6,000 Oe is required to reorient completely the fixed ferromagnetic multilayer which is comprised of an antiparallel coupled multilayer 30 Å Co/7 ÅRu/25 Å Co similar to that of the structure whose response is shown in FIGS. 5B and 5C. This field is clearly much larger than the field required to reorient the fixed ferromagnetic layer of the structure of FIG. 5A. This is an important advantage of using the antiferromagnetically coupled multilayer 118. The effective exchange bias field provided by the antiferromagnetic layer 116 is significantly enhanced by approximately the factor $\{t_{225}+t_{200}\}/|t_{225}-t_{200}|$, where $t_{225}$ and $t_{200}$ represent the thickness of the respective films in the multilayer 118. This is also shown by examining the response of the MTJ device of FIG. 7A over a more limited field range, as shown in FIG. 7B. FIG. 7B shows the resistance versus field curve of the same device as in FIG. 7A over a range of +/−200 Oe. The MTJ device exhibits a well-pronounced step in resistance with no evidence for any reorientation of the fixed ferromagnetic layer. The state of the magnetic moments of the films in the antiparallel coupled fixed ferromagnetic layer and the sensing ferromagnetic layers are indicated schematically in FIG. 7A and B by arrows.

Similar improvements in the exchange biasing of the fixed ferromagnetic layer by using an antiparallel coupled fixed ferromagnetic multilayer are also obtained for structures in which the sensing ferromagnetic layer is an antiparallel coupled multilayer.

In the present invention the antiparallel coupled fixed ferromagnetic multilayer 118 is deposited directly on top of an antiferromagnetic layer 116. Layer 116 is itself grown on a crystallographically conforming template layer. In contrast, film 245 (or subfilm 240) is grown on the tunnel barrier layer 120 which is amorphous and has no well defined crystallographic structure. Thus the crystalline nature of layer 245 is unrelated to that of the layers within the fixed ferromagnetic multilayer 118 on the opposite side of the tunnel barrier layer 120. Similarly the flatness of the tunneling barrier layer 120, which is amorphous and insulating, is very different from that of the thin metallic layers from which the rest of the MTJ device is constructed. Thus, prior to the present invention it was not apparent that it would be possible to grow an antiparallel coupled sensing ferromagnetic multilayer since this requires the growth of an extremely thin and flat antiferromagnetically coupling film 260.

It is believed that the growth of an antiparallel coupled ferromagnetic multilayer on top of the tunneling barrier 120 will be enhanced if the films comprising the multilayer are relatively thick. This is because sputter deposited thin metallic films are typically polycrystalline with crystalline grains of size approximately that of the thin film thickness. The use of an antiferromagnetically coupling film enables the usage of films in fixed and sensing ferromagnetic multilayers which are thicker than otherwise the thickness of single ferromagnetic fixed or sensing films without antiferromagnetically coupling films for the same application. Thus the use of antiferromagnetically coupling films enables greater flexibility in the choice of film thicknesses in the multilayer and thus additional control over the physical properties of the films. In particular, it is difficult to grow an inverted magnetic tunnel junction structure with the sensing ferromagnetic layer deposited first and the exchange biased fixed ferromagnetic layer deposited on top of the tunnel barrier layer unless relatively thick fixed ferromagnetic layers are used to enable a suitable conforming layer to be developed on which the exchange bias layer can be deposited. With thin fixed ferromagnetic layers, such as 50 Å permalloy, very little exchange bias with, for example, MnFe layers is obtained. However, antiferromagnetically coupling films allow the use of much thicker films in the multilayer which are suitable conforming template layers and which then allow reasonable values of exchange bias field to be developed. For this reason, while the MTJ device described and shown in FIG. 4B has the fixed ferromagnetic multilayer 118 on the bottom of the MTJ device, the device can also be formed by depositing the sensing ferromagnetic multilayer 132 first, followed by the tunnel barrier layer 120, the fixed ferromagnetic multilayer 118, and the antiferromagnetic exchange bias layer 116. Such a MTJ device would then have the layers essentially inverted from the MTJ device shown in FIG. 4B.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device comprising:

a fixed ferromagnetic multilayer whose magnetic moment is fixed in a preferred direction in the presence of an applied magnetic field, the fixed ferromagnetic multilayer comprising first and second ferromagnetic films antiferromagnetically coupled to one another and an antiferromagnetically coupling film located between and in contact with the first and second ferromagnetic films;

a free ferromagnetic multilayer whose magnetic moment is free to rotate in the presence of an applied magnetic field, the free ferromagnetic multilayer comprising first and second ferromagnetic films antiferromagnetically coupled to one another and an antiferromagnetically coupling film located between and in contact with the first and second ferromagnetic films; and an insulating tunneling layer located between and in contact with the fixed ferromagnetic multilayer and the free ferromagnetic multilayer for permitting tunneling current between the fixed and free ferromagnetic multilayers.

2. The magnetic tunnel junction device according to claim 1 wherein the magnetic moments of the fixed and free ferromagnetic multilayers are substantially parallel or antiparallel to one another in the absence of an applied magnetic field.

3. The magnetic tunnel junction device according to claim 1 wherein the free ferromagnetic multilayer's magnetic moment is substantially perpendicular to the fixed ferromagnetic multilayer's magnetic moment in the absence of an applied magnetic field.

4. The magnetic tunnel junction device according to claim 1 wherein the magnetic tunnel junction stack further comprises an antiferromagnetic layer in contact with the fixed ferromagnetic multilayer for fixing the magnetic moment of the fixed ferromagnetic multilayer in said preferred direction by interfacial exchange coupling.

5. The magnetic tunnel junction device according to claim 1 further comprising a substrate, and wherein the fixed ferromagnetic multilayer, the insulating tunneling layer and the free ferromagnetic multilayer are formed on the substrate, whereby tunneling current passes through the insulating tunneling layer in a direction generally perpendicular to the fixed and free ferromagnetic multilayers when the fixed and free ferromagnetic multilayers are connected to electrical circuitry.

6. The magnetic tunnel junction device according to claim 1 wherein the first and second ferromagnetic films in each of said multilayers are formed of Co or a Ni—Fe alloy and the antiferromagnetically coupling film in each of said multilayers is formed of Ru.

7. The magnetic tunnel junction device according to claim 1 wherein the first ferromagnetic film in each of said multilayers is formed of first and second ferromagnetic subfilms, the first subfilm being in contact with the insulating tunneling layer and being formed of a material selected from the group consisting of Co, $Co_{(100-x)}Fe_{(x)}$ (where x is the range of 20 to 70) and $Ni_{(100-x)}Fe_x$ (where x is approximately 60).

8. A magnetic tunnel junction read sensor for detecting external magnetic fields from magnetically recorded data, the sensor comprising:

a fixed ferromagnetic multilayer whose magnetic moment is fixed in a preferred direction in the presence of an applied magnetic field in the range of the external magnetic field to be sensed, the fixed multilayer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetic moments are aligned antiparallel with one another and remain antiparallel in the presence of an applied magnetic field;

a sensing ferromagnetic multilayer whose magnetic moment is oriented generally perpendicular to the moment of the fixed ferromagnetic multilayer in the absence of an applied magnetic field and is free to rotate away from said perpendicular orientation in the presence of an applied magnetic field in the range of the external magnetic field to be sensed, the sensing ferromagnetic multilayer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetic moments are aligned antiparallel with one another and remain antiparallel in the presence of an applied magnetic field;

an insulating tunnel barrier layer located between and in contact with the first film of the fixed ferromagnetic multilayer and the first film of the sensing ferromagnetic multilayer for permitting tunneling current in a direction generally perpendicular to the fixed ferromagnetic multilayer and the free ferromagnetic layer; and a substrate, wherein the fixed ferromagnetic multilayer, tunneling barrier layer and sensing ferromagnetic multilayer are formed on the substrate; whereby when the fixed ferromagnetic multilayer and the sensing ferromagnetic multilayer are exposed to the external magnetic field to be sensed, the magnetic moment of the sensing ferromagnetic multilayer will change its orientation relative to the magnetic moment of the fixed ferromagnetic multilayer and the electrical resistance to current flow through the insulating tunnel barrier layer in a direction generally perpendicular to the fixed ferromagnetic multilayer and the sensing ferromagnetic multilayer will be altered, thereby allowing the external magnetic field to be detected.

9. The magnetic tunnel junction read sensor according to claim 8 further comprising an antiferromagnetic layer in contact with the fixed ferromagnetic multilayer for fixing the magnetic moment of the fixed ferromagnetic multilayer in said preferred direction by interfacial exchange coupling.

10. The magnetic tunnel junction read sensor according to claim 8 wherein the first and second ferromagnetic films in each of said fixed and sensing ferromagnetic multilayers are formed of Co or a Ni—Fe alloy and the antiferromagnetically coupling film in each of said multilayers is formed of Ru.

11. The magnetic tunnel junction read sensor according to claim 8 wherein the first ferromagnetic film in each of said fixed and sensing multilayers is formed of first and second ferromagnetic subfilms, the first subfilm in each of said multilayers being in contact with the insulating tunnel barrier layer and being formed of a material selected from the group consisting of Co, $Co_{(100-x)}Fe_{(x)}$ (where x is in the range of 20 to 70) and $Ni_{(100-x)}Fe_x$ (where x is approximately 60).

12. The magnetic tunnel junction read sensor according to claim 8 further comprising a biasing ferromagnetic layer for longitudinally biasing the magnetic moment of the sensing ferromagnetic multilayer in a direction generally perpendicular to the magnetic moment of the fixed ferromagnetic multilayer in the absence of an applied magnetic field, and an electrically insulating layer located between the biasing ferromagnetic layer and sensing ferromagnetic multilayer for electrically isolating the biasing ferromagnetic layer from the sensing ferromagnetic multilayer.

\* \* \* \* \*